United States Patent [19]

Hioki et al.

[11] Patent Number: 5,407,780
[45] Date of Patent: Apr. 18, 1995

[54] RADIATION-SENSITIVE POSITIVE RESIST COMPOSITION COMPRISING AN ALKALI-SOLUBLE RESIN MADE FROM M-CRESOL, 2-TERT-BUTL-5-METHYL PHENOL AND FORMALDEHYDE

[75] Inventors: Takeshi Hioki, Osaka; Seiko Kurio, Hyogo; Yasunori Uetani; Yasunori Doi, both of Osaka; Hiroshi Moriuma, Nara, all of Japan

[73] Assignee: Sumitomo Chemical Company, Limited, Osaka, Japan

[21] Appl. No.: 240,817

[22] Filed: May 11, 1994

Related U.S. Application Data

[63] Continuation of Ser. No. 634,037, Dec. 26, 1990, abandoned.

[30] Foreign Application Priority Data

Dec. 27, 1989 [JP] Japan .................................. 1-341463
Jul. 2, 1990 [JP] Japan .................................. 2-175698
Jul. 5, 1990 [JP] Japan .................................. 2-178968

[51] Int. Cl.⁶ .......................... G03F 7/023; G03F 7/30
[52] U.S. Cl. ..................................... 430/192; 430/165; 430/191; 430/193
[58] Field of Search ................. 430/165, 192, 193, 191

[56] References Cited

U.S. PATENT DOCUMENTS

| | | | |
|---|---|---|---|
| 4,123,279 | 10/1978 | Kobayashi | 430/192 |
| 4,308,368 | 12/1981 | Kubo et al. | 430/190 |
| 4,477,553 | 10/1984 | Yamamoto et al. | 430/193 |
| 4,731,319 | 3/1988 | Kohara et al. | 430/165 |
| 4,797,346 | 1/1989 | Yamamoto et al. | 430/192 |
| 4,812,551 | 3/1989 | Oi et al. | 430/192 |
| 4,906,549 | 3/1990 | Asaumi et al. | 430/192 |
| 4,920,028 | 4/1990 | Lazarus et al. | 430/165 |
| 4,978,810 | 12/1990 | Kanayama et al. | 568/720 |
| 4,983,492 | 1/1991 | Trefonas, III et al. | 430/326 |
| 4,988,601 | 1/1991 | Ushirogouchi et al. | 430/192 |
| 5,001,040 | 3/1991 | Blakeney et al. | 430/192 |
| 5,019,479 | 5/1991 | Oka et al. | 430/193 |

FOREIGN PATENT DOCUMENTS

| | | |
|---|---|---|
| 0239423 | 9/1987 | European Pat. Off. . |
| 0358871 | 3/1990 | European Pat. Off. . |
| 2512933 | 10/1975 | Germany . |
| 50-125806 | 10/1975 | Japan . |
| 54-116218 | 9/1979 | Japan . |
| 55-123614 | 9/1980 | Japan . |
| 55-127553 | 10/1980 | Japan . |
| 57-23253 | 5/1982 | Japan . |
| 260146 | 3/1987 | Japan . |
| 62-227144 | 10/1987 | Japan . |
| 62-230146 | 11/1987 | Japan . |
| 62-260145 | 11/1987 | Japan . |
| 62-260146 | 11/1987 | Japan . |
| 62-260147 | 11/1987 | Japan . |
| 62-60407 | 12/1987 | Japan . |
| 64-50044 | 2/1989 | Japan . |

OTHER PUBLICATIONS

Derwent Publications Ltd., London GB and JP-A-1180535 (Konika, Mitsubishi Kasei) abstract only.

Primary Examiner—Charles L. Bowers, Jr.
Assistant Examiner—John S. Chu
Attorney, Agent, or Firm—Birch, Stewart, Kolasch & Birch

[57] ABSTRACT

A positive resist composition containing a 1,2-quinone diazide compound and an alkali-soluble resin which constitutes a resin (I) obtainable through a condensation reaction of a phenol mixture containing m-cresol and 2-tert.-butyl-5-methylphenol with an aldehyde., which has well balanced sensitivity, resolution and heat resistance properties.

21 Claims, 2 Drawing Sheets

RADIATION-SENSITIVE POSITIVE RESIST COMPOSITION COMPRISING AN ALKALI-SOLUBLE RESIN MADE FROM M-CRESOL, 2-TERT-BUTL-5-METHYL PHENOL AND FORMALDEHYDE

This application is a continuation of application Ser. No. 07/634,037, filed on Dec. 26, 1990, now abandoned.

BACKGROUND OF THE INVENTION

FIELD OF THE INVENTION

The present invention relates to a resist composition which comprises a sensitizer and is sensitive to ultraviolet rays (G-line, H-line, I-line and so on), far ultraviolet rays (excimer laser and so on), electron rays, ion beam and radio-active rays, e.g. X rays.

Recently, particularly in the production of integrated circuits, miniaturization has proceeded as the integration level has increased, which results in demands for formation of patterns of submicron order and improved resolution. According to conventional processes for the production of integrated circuits, light exposure is accomplished by placing a mask in intimate contact to a substrate, e.g. a silicon wafer. It is said that this process cannot make patterns thinner than 2 μm. Instead of such conventional processes, the reduction projection exposure system attracts attention. According to this new system, a pattern of a master mask (reticle) is projected on the substrate with reduction by a lens system, whereby exposure is accomplished.

One of the serious problems in this system is low throughput. Namely, in this system, the total exposure time to expose a wafer is very long because of divided and repeated light exposure unlike a batch light exposure system which is employed in the conventional mask contact printing methods.

To solve this problem, not only an improvement in the apparatus but also an increase in sensitivity of the resist to be used are important. If the exposure time can be shortened by an increase in the sensitivity, the throughput and in turn the yield can be improved.

On the other hand, as the distance between the two adjacent lines is decreased with an increase in the integration level, dry etching is predominantly used rather than wet etching. The photoresist should have better heat resistance than ever.

When the positive photoresist now in practical use is checked from this standpoint, its sensitivity, resolution and heat resistance are not necessarily satisfactory. Generally, the positive photoresist has lower sensitivity than the negative photoresist and improvement in the sensitivity of the former is desired.

To increase the sensitivity, it is easiest to decrease a molecular weight of a novolak resin used in the positive photoresist. The decrease of the novolak resin molecular weight accelerates dissolution of the photoresist in an alkaline developing solution so that the apparent sensitivity of the photoresist is increased.

This method, however, has a very serious disadvantage that the heat resistance of the photoresist deteriorates. Moreover, it encounters some problems, e.g. large film thickness loss in an unexposed area (reduction of so-called film thickness retention), a worsening shape of the pattern and, deterioration of the γ-value because of small differences in the dissolving rates in the developing solution between the exposed area and the unexposed area.

In view of this, positive resists satisfying sensitivity, resolution and heat resistance requirements at the same time have not been on the market up to now. Attempts to improve one of these three characteristics, leaves at least one of the remaining characteristics impaired.

In addition, some of the conventional photoresist compositions have weak adhesiveness to a substrate to be used in the IC element such as silicon dioxide, phosphorus silicate glass, silicon nitride or aluminum, so that when a film formed from such composition is exposed through the resist, a part of the exposed pattern disappears.

SUMMARY OF THE INVENTION

One object of the present invention is to provide a positive resist composition which can overcome the above problems associated with the conventional positive resist compositions.

Another object of the present invention is to provide a positive resist composition which has well balanced properties such as sensitivity, resolution and heat resistance and gives a pattern which is hardly peeled off from a substrate.

Accordingly, the present invention provides a positive resist composition comprising a 1,2-quinone diazide compound and an alkali-soluble resin which comprises a resin (I) obtainable through a condensation reaction of a phenol mixture containing m-cresol and 2-tert.-butyl-5-methylphenol with an aldehyde. The phenol mixture may further contain o-cresol and/or p-cresol.

DETAILED DESCRIPTION OF THE INVENTION

The resin (I) can be prepared by a condensation reaction of the phenol mixture with the aldehyde in the presence of an acid catalyst.

A molar ratio of m-cresol to 2-tert.-butyl-5-methylphenol, is preferably from 95:5 to 60:40, more preferably from 95:5 to 70:30. In this range, the patterning and development can be easily done.

Figure 1:
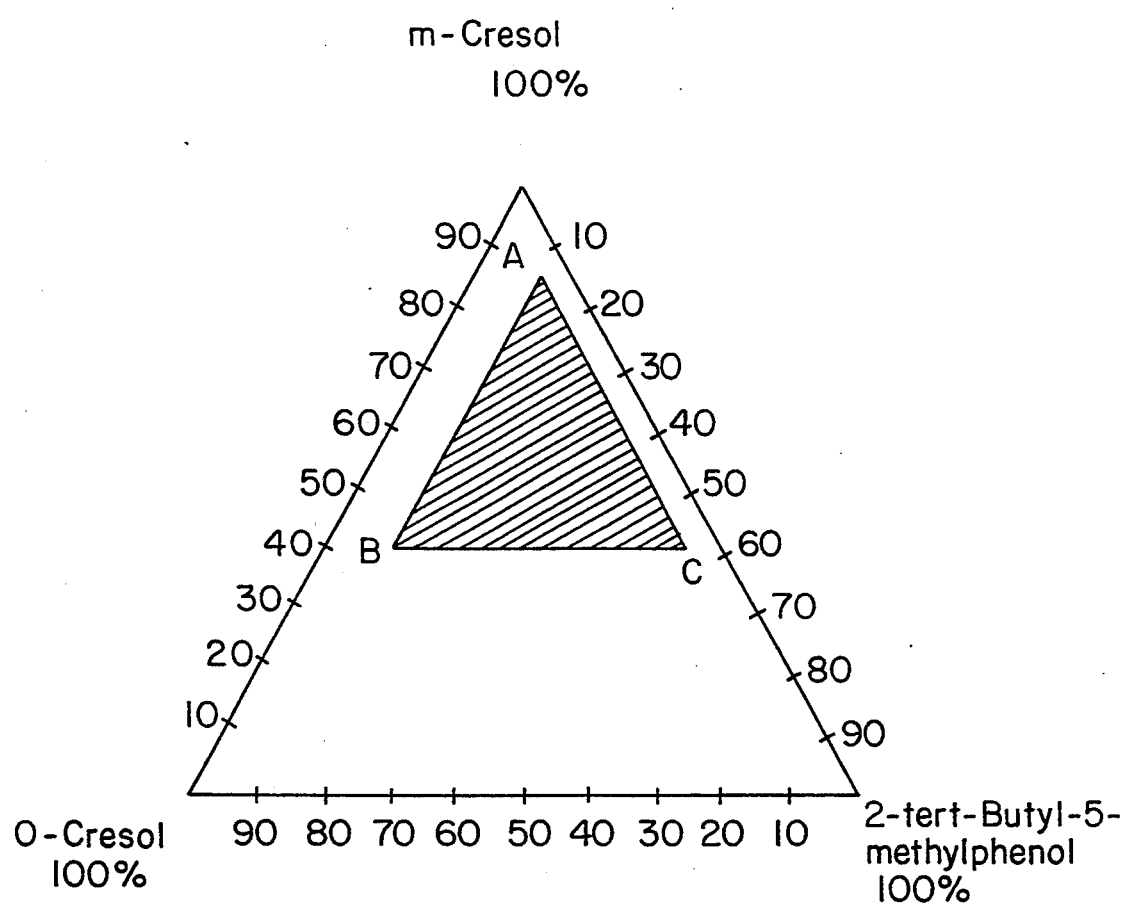
FIGS. 1 and 2 are ternary diagrams indicating preferred molar ratios among m-cresol, o-cresol and 2-tert.-butyl-5-methylphenol and among m-cresol, p-cresol and 2-tert.-butyl-5-methylphenol, respectively for the preparation of the resin (I).

When o-cresol is used, the phenol mixture preferably contains 40 to 85% by mole of m-cresol, 5 to 50% by mole of o-cresol and 10 to 55% by mole of 2-tert.-butyl-5-methylphenol. This percentage range is represented by a hatched area (including the border lines) in a ternary diagram of FIG. 1. The hatched area is defined by three vertexes A, B and C:

| A: | |
|---|---|
| m-cresol | 85% by mole |
| o-cresol | 5% by mole |
| 2-tert.-butyl-5-methylphenol | 10% by mole |
| B: | |
| m-cresol | 40% by mole |
| o-cresol | 50% by mole |
| 2-tert.-butyl-5-methylphenol | 10% by mole |
| C: | |
| m-cresol | 40% by mole |
| o-cresol | 5% by mole |

| | |
|---|---|
| -continued | |
| 2-tert.-butyl-5-methylphenol | 55% by mole |

Figure 2:
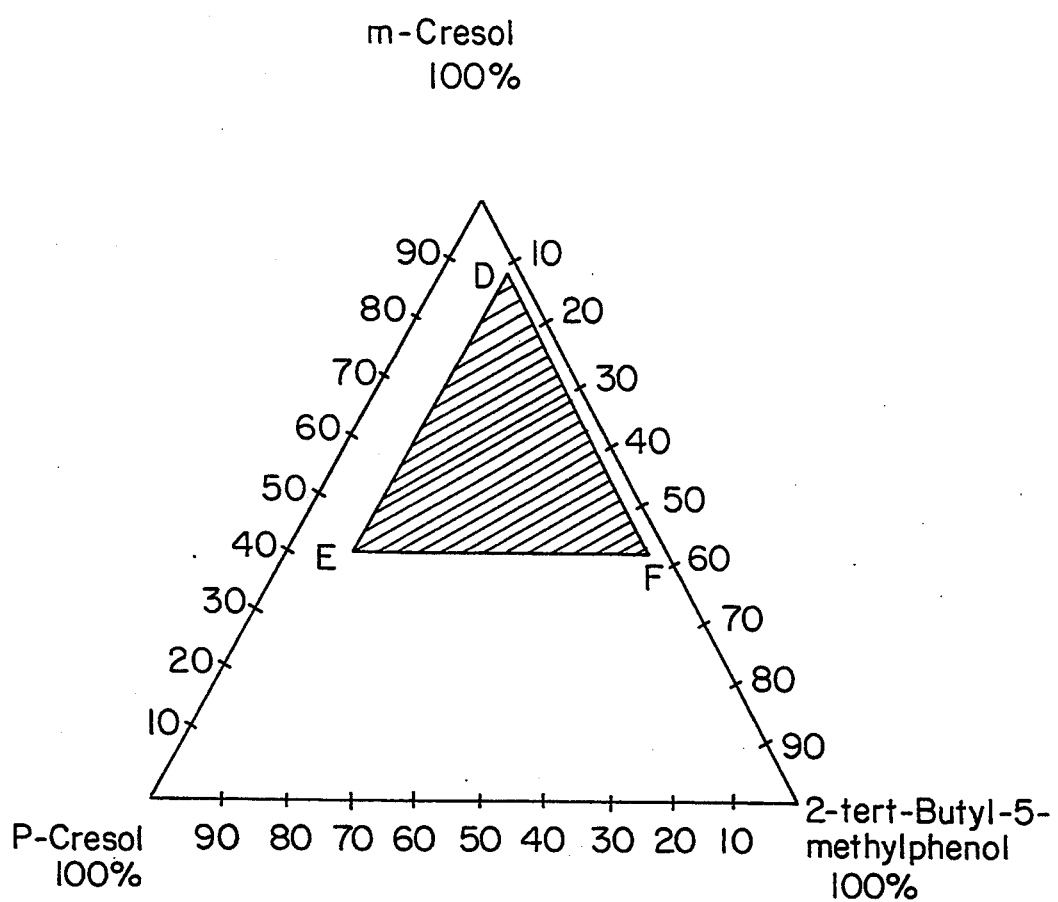

When p-cresol is used, the phenol mixture preferably contains 40 to 87.5% by mole of m-cresol, 2.5 to 50% by mole of p-cresol and 10 to 57.5% by mole of 2-tert.-butyl-5-methylphenol. This percentage range is represented by a hatched area (including the border lines) in a ternary diagram of FIG. 2. The hatched area is defined by three vertexes D, E and F:

| | |
|---|---|
| D: | |
| m-cresol | 87.5% by mole |
| p-cresol | 2.5% by mole |
| 2-tert.-butyl-5-methylphenol | 10% by mole |
| E: | |
| m-cresol | 40% by mole |
| p-cresol | 50% by mole |
| 2-tert.-butyl-5-methylphenol | 10% by mole |
| F: | |
| m-cresol | 40% by mole |
| p-cresol | 2.5% by mole |
| 2-tert.-butyl-5-methylphenol | 57.5% by mole |

The phenol mixture may further contain one or more phenols other than o-cresol and p-cresol.

Examples of the aldehyde are formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, glutaraldehyde, glyoxal, o-methylbenzaldehyde, p-methylbenzaldehyde and so on. They may be used alone or in combination. In particular, formaldehyde which is commercially mass produced is suitably used.

Examples of the acid catalyst to be used in this condensation reaction include organic or inorganic acids (e.g. oxalic acid, hydrochloric acid, sulfuric acid, perchloric acid, p-toluenesulfonic acid, trichloroacetic acid, phosphoric acid, formic acid, etc.) and salts with divalent metals (e.g. zinc acetate, magnesium acetate, etc.) and so on.

The condensation reaction may be carried out in the presence or absence of a solvent.

The condensation reaction may be carried out at a temperature of 60° to 120° C. for 2 to 30 hours.

The alkali-soluble resin of the present invention may contain other alkali-soluble resin insofar as the characteristics of the present invention are not deteriorated.

Preferred examples of the other alkali-soluble resins are polyvinylphenol, a novolak resin and so on. The novolak resin is prepared by an addition condensation reaction of a phenol compound with formaldehyde. Specific examples of the phenol compound used as one of the raw materials for the synthesis of the novolak resin include phenol, o-cresol, m-cresol, p-cresol, 2,5-xylenol, 3,5-xylenol, 3,4-xylenol, 2,3,5-trimethylphenol, 4-tert.-butylphenol, 2-tert.-butylphenol, 3-tert.-butylphenol, 3-ethylphenol, 2-ethylphenol, 4-ethylphenol, 2-naphthol, 1,3-dihydroxynaphthalene, 1,7-dihydroxynaphthalene, 1,5-dihydroxynaphthalene, etc. These phenols may be used alone or in combination.

In particular, when the resin (I) is fractionated after the condensation reaction and has, in a gel permeation chromatographic pattern (GPC pattern) measured by using a UV light (254 nm) detector, an area ratio of a range in which the molecular weight as converted to polystyrene is not larger than 6000 does not exceed 65% and an area ratio of a range in which the molecular weight as converted to polystyrene is not larger than 900 does not exceed 30%, as the alkali-soluble resin, is preferably used a compound of the formula:

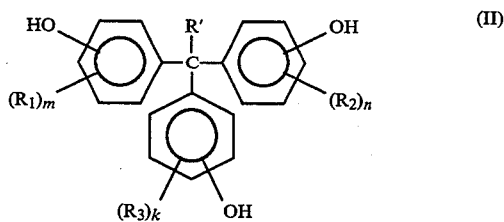

wherein $R_1$, $R_2$ and $R_3$ are the same or different and each a $C_1$-$C_5$ alkyl group or a $C_1$-$C_5$ alkoxy; R' is a hydrogen atom of a $C_1$-$C_3$ alkyl group; and k, m and n are each an integer of 0 to 3, or a low molecular weight novolak (III) having a weight average molecular weight of 2000 to 200 as converted to polystyrene.

An amount of the compound (II) or the low molecular weight novolak (III) is from 4 to 50 parts by weight per 100 parts of the total weight of all the alkali-soluble resins, namely the resin (I), the compound (II) or the low molecular weight novolak (III), and the optionally used other alkali-soluble resin. In this range, the patterning and development are easily carried out.

The resin (I) having the above area ratios can be obtained by fractionation. For example, the synthesized novolak resin is dissolved in a good solvent, and a resulting solution is poured in water to precipitate the novolak resin. Alternatively, a synthesized novolak resin is poured into heptane, hexane, pentane, cyclohexane, etc. to fractionate it.

Examples of the good solvent are alcohols (e.g. methanol, ethanol, etc.), ketones (e.g. acetone, methyl ethyl ketone, methyl isobutyl ketone, etc.), ethyleneglycols and its ethers or ether esters (e.g. ethylcellosolve, ethylcellosolve acetate, etc.), tetrahydrofurane and so on.

The obtained resin preferably has a weight average molecular weight of from 20,000 to 3000 as converted to polystyrene.

As the compound (II), the following compounds are preferably used:

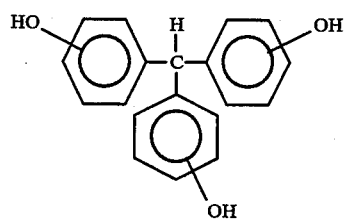

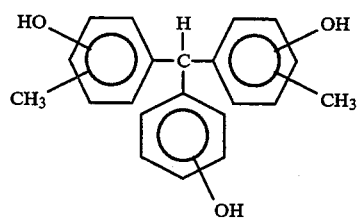

-continued

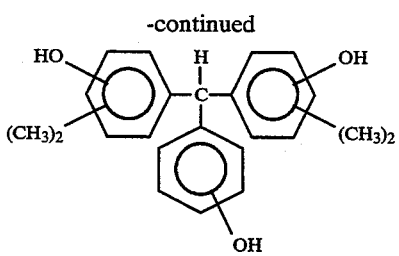

more preferably,

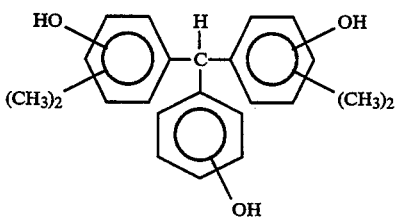

Most preferred compounds are

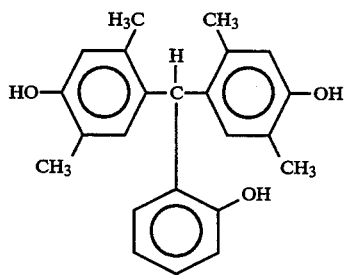

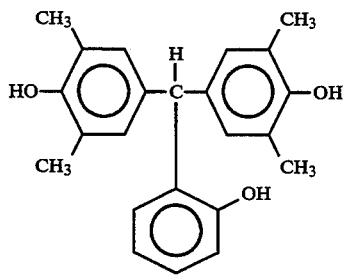

The compound (II) can be prepared by a condensation reaction of a phenol compound with a carbonyl compound in the presence of an acid catalyst.

Examples of the phenol compound which is condensed with the carbonyl compound include phenol, o-cresol, m-cresol, p-cresol, 3,5-xylenol, 2,5-xylenol, 2,3-xylenol, 2,4-xylenol, 2,6-xylenol, 3,4-xylenol, 2,3,5-trimethylphenol, 4-tert.-butylphenol, 2,-tert.-butylphenol, 3-tert.-butylphenol, 4-methoxyphenol, 3-methoxyphenol, 2-methoxyphenol, 2,3-dimethoxyphenol, 2,5-dimethoxyphenol, 3,5-dimethoxyphenol, 3-ethylphenol, 2-ethylphenol, 4-ethylphenol, 2,3,5-triethylphenol, 3,5-diethylphenol, 2,5-diethylphenol, 2,3-diethylphenol and so on.

These phenol compounds may be used alone or in combination.

Examples of the carbonyl compound are benzophenones (e.g. benzaldehyde, o-hydroxybenzaldehyde, m-hydroxybenzaldehyde, p-hydroxybenzaldehyde, 3-methoxy-4-hydroxybenzaldehyde, etc.) and acetophenones (e.g. o-hydroxyacetophenone, m-hydroxyacetophenone, p-hydroxyacetophenone, etc.) and the like.

These carbonyl compounds may be used alone or in combination.

Examples of the acid catalyst to be used in this condensation reaction include organic acids or inorganic acids (e.g. oxalic acid, formic acid, p-toluenesulfonic acid, trichloroacetic acid, hydrochloric acid, sulfuric acid., perchloric acid, phosphoric acid, etc.), salts of divalent metals (e.g. zinc acetate, zinc chloride, magnesium acetate, etc.) and so on.

The amount of the carbonyl compound to be used in the condensation reaction is from 0.02 to 3 moles per mole of the phenol compound. The amount of the acid catalyst to be used in the condensation reaction is from 0.01 to 0.7 mole per mole of the carbonyl compound.

This condensation reaction may be carried out at a temperature of 30° to 250° C. for 2 to 30 hours.

The reaction may be carried out in the presence or absence of a solvent.

Suitable solvents include water, alcohols (e.g. methanol, ethanol, isopropanol, n-butanol, isoamyl alcohol, etc.), ethylcellosolve acetate, ethylcellosolve, methylcellosolve, methyl isobutyl ketone, methyl ethyl ketone, hexane, cyclohexane, heptane, benzene, toluene, xylene and so on.

Preferably, the amount of the solvent is from 10 to 500 parts by weight per 100 parts by weight of the total weight of phenol compound and the carbonyl compound.

After removing the metal ions, the condensation product can be purified by a suitable method such as recrystallization and reprecipitation.

One method for the removal of the metal ions is as follow:

The product is dissolved in an organic solvent which can be separated from a mixture with water, and washed with ion-exchanged water. Examples of such organic solvent include methyl isobutyl ketone, ethylcellosolve acetate, ethyl acetate and so on.

Another method for the removal of the metal ions is as follow:

The product is dissolved in an organic solvent which is not separated from a mixture with water, and charged into ion-exchanged water to precipitate the product. Examples of such organic solvent include methanol, ethanol, acetone and so on. This method is preferred, because the removal of the metal ions and purification of the condensation product are done at the same time.

The low molecular weight novolak (III) is prepared through a condensation reaction of a phenol compound with an aldehyde in the presence of an acid catalyst.

Examples of the phenol compound which is condensed with the aldehyde include phenol, o-cresol, m-cresol, p-cresol, 3,5-xylenol, 2,5-xylenol, 2,3-xylenol, 2,4-xylenol, 2,6-xylenol, 3,4-xylenol, 2,3,5-trimethylphenol, resorcinol and so on. Among them, cresol isomers are preferably used.

These phenol compounds may be used alone or in combination by taking their solubility in an alkaline developer into consideration.

Examples of the aldehyde is formaldehyde, paraformaldehyde, acetaldehyde, glyoxal and so on. In particular, 37% formalin which is commercially mass produced is suitably used.

As the acid catalyst, those as exemplified in the above may be used.

This condensation reaction is carried out at a temperature of 30° to 250° C. for 2 to 30 hours.

The reaction may be carried out in the presence or absence of a solvent.

The low molecular weight novolak (III) has a weight average molecular weight of 200 to 2000, more preferably 200 to 1000, as converted to polystyrene. When the low molecular weight novolak (III) exceeds 2000, the sensitivity of the composition is deteriorated. When it has the weight average molecular weight smaller than 200, the photoresist composition has poor adhesion to a substrate or heat resistance.

The molecular weight of the low molecular weight novolak (III) is easily controlled through control of a molar ratio of the aldehyde to the phenol compound.

To prepare the novolak resin (III) having the weight average molecular weight of 200 to 2000 as converted to polystyrene in case of m-cresol-formaldehyde resin, a molar ratio of m-cresol to formaldehyde in the condensation reaction is preferably from 0.65 to 0.05.

Preferably, unreacted monomers are removed through distillation.

The 1,2-quinone diazide compound to be used as a sensitizer in the positive resist composition of the present invention is not limited. Specific examples of the 1,2-quinone diazide compound are 1,2-benzoquinone diazide-4-sulfonic acid ester, 1,2-naphthoquinone diazide-4-sulfonic acid ester, 1,2-naphthquinone diazide-5-sulfonic acid ester, etc.

Above esters may be prepared by per se conventional methods. For example, the ester is prepared by a condensation reaction of a compound having a hydroxyl group with 1,2-naphthoquinone diazide sulfonyl chloride or benzoquinone diazide sulfonyl chloride in the presence of a weak alkali.

Examples of the compound having a hydroxyl group are hydroquinone, resorcinol, phloroglucin, 2,4-dihydroxybenzophenone, 2,3,4-trihydroxybenzophenone, 2,3,4,4'-tetrahydroxybenzophenone, 2,2',4,4'-tetrahydroxybenzophenone, bis(p-hydroxyphenyl)methane, bis(2,4-dihydroxyphenyl)methane, bis(2,3,4-trihydroxyphenyl)methane, 2,2-bis(2,4-dihydroxyphenyl)propane, 2,2-bis(2,3,4-trihydroxyphenyl)propane, hydroxyflavan compounds and the like. Among them, ester of 2,3,4,4'-tetrahydroxybenzophenone (at least two hydroxy groups on the average are esterified) or hydroxyflavan compounds (at least two hydroxy groups on the average are esterified) of the formula:

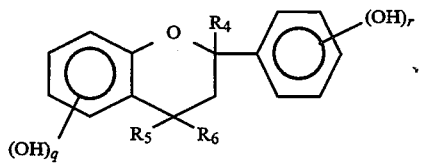

wherein q is a number of 0 to 4, r is a number of 1 to 5, and $R_4$, $R_5$ and $R_6$ are respectively a hydrogen atom, an alkyl group, an alkenyl group, a cyclohexyl group or an aryl group, with 1,2-naphthoquinonediazide-5-sulfonic acid are preferably used as 1,2-quinonediazide compound.

The positive resist composition of the present invention may contain two or more 1,2-quinonediazide compounds in combination.

The positive resist composition is prepared by mixing and dissolving the 1,2-quinonediazide compound and the resin (I) and optionally the compound (II) or the low molecular weight novolak resin (III) in a solvent.

The amount of the 1,2-quinonediazide compound is 5 to 100, preferably 10 to 50 parts by weight per 100 parts by weight of the alkali-soluble resin.

When the amount of the 1,2-quinonediazide compound is 5 to 100 parts by weight, it is easy to make the pattern, and the positive resist composition has excellent sensitivity.

Preferably, the used solvent evaporates at a suitable drying rate to give a uniform and smooth coating film. Such a solvent includes ethylcellosolve acetate, methylcellosolve acetate, ethylcellosolve, methylcellosolve, propyleneglycol monomethyl ether acetate, butyl acetate, methyl isobutyl ketone, xylene, etc.

To the positive photoresist composition obtained by the foregoing method, small amounts of resins, dyes, etc. may be added if desired.

The resist composition of the present invention has well balanced properties. In particular, it does not suffer from pattern disappearance during exposure.

PREFERRED EMBODIMENTS OF THE INVENTION

The present invention will be illustrated more in detail with the following Examples, but it is not limited to these Examples. In Examples, "parts" are by weight unless otherwise indicated.

Synthetic Example 1

Into a three-necked 1000 ml flask, m-cresol, (229.8 g), 2-tert.-butyl-5-methylphenol (61.6 g) [a molar ratio of m-cresol to 2-tert.-butyl-5-methylphenol being 85:15], ethylcellosolve acetate (252 g) and a 5% solution of oxalic acid (30.4 g) were charged. To the mixture which was heated on an oil bath kept at 100° C., a 37% aqueous solution of formalin (180.2 g) was dropwise added while stirring over 40 minutes, followed by heating and stirring for 14 hours. Thereafter, the mixture was neutralized, washed with water and dehydrated to obtain a solution of a novolak resin in ethylcellosolve acetate. The weight average molecular weight measured by GPC was 4100 as converted to polystyrene.

Synthetic Example 2

In the same manner as in Synthetic Example 1 but changing the reaction time, the reaction was carried out to obtain a solution of a novolak resin in ethylcellosolve acetate. The novolak resin had a weight average molecular weight measured by GPC of 2850 as converted to polystyrene.

Synthetic Example 3

In the same manner as in Synthetic Example 1 but changing the reaction time, the reaction was carried out to obtain a solution of a novolak resin in ethylcellosolve acetate. The novolak resin had a weight average molecular weight measured by GPC of 5270 as converted to polystyrene.

Synthetic Example 4

In the same manner as in Synthetic Example 1 but changing the molar ratio of m-cresol to 2-tert.-butyl-5-methylphenol to 90:10, the reaction was carried out to obtain a solution of a novolak resin in ethylcellosolve acetate. The novolak resin had a weight average molecular weight measured by GPC of 5950 as converted to polystyrene. An area ratio in GPC of a range in which the molecular weight as converted to polystyrene is not larger than 6000 was 65.7% and an area ratio in GPC of a range in which the molecular weight as converted to polystyrene is not larger than 900 was 25.5%.

Synthetic Example 5

In the same manner as in Synthetic Example 1 but changing the molar ratio of m-cresol to 2-tert.-butyl-5-methylphenol to 87.5:12.5, the reaction was carried out to obtain a solution of a novolak resin in ethylcellosolve acetate. The novolak resin had a weight average molecular weight measured by GPC of 8000 as converted to polystyrene.

Synthetic Example 6

The solution of the novolak resin in ethylcellosolve acetate obtained in Synthetic Example 1 (the content of the novolak resin being 41.94%) (155.3 g) was charged in a separable flask having an outlet in a bottom, and then ethylcellosolve acetate (170.4 g) and n-heptane (151.1 g) were added. The mixture was stirred at 20° C. for 30 minutes, kept standing and separated. From the separated lower layer, n-heptane was evaporated off by an evaporator to obtain a solution of a novolak resin in ethylcellosolve acetate. The novolak resin had a weight average molecular weight measured by GPC of 5800 as converted to polystyrene. An area ratio in GPC of a range in which the molecular weight as converted to polystyrene is not larger than 6000 was 59.3%, and an area ratio in GPC of a range in which the molecular weight as converted to polystyrene is not larger than 900 was 19.0%.

Synthetic Examples 7 to 10

In the same manner as in Synthetic Example 6 but using one of the novolak resins prepared in Synthetic Examples 2 to 5, a novolak resin shown in Table 1 was obtained.

TABLE 1

| Synthetic Example No. | Used novolak resin prepared in | Molecular weight*[1] | Area ratio*[2] (%) | Area ratio*[3] (%) |
|---|---|---|---|---|
| 7 | Syn. Ex. 2 | 5300 | 61.4 | 15.8 |
| 8 | Syn. Ex. 3 | 9140 | 35.2 | 9.3 |
| 9 | Syn. Ex. 4 | 9000 | 44.7 | 12.5 |
| 10 | Syn. Ex. 5 | 11300 | 39.3 | 12.8 |

Note:
*[1] A weight average molecular weight measured by GPC and converted to polystyrene.
*[2] An area ratio in GPC of a range in which the molecular weight as converted to polystyrene is not larger than 6000.
*[3] An area ratio in GPC of a range in which the molecular weight as converted to polystyrene is not larger than 900.

Synthetic Example 11

Into a 500 ml flask equipped with a stirrer, a condenser, a water separator and a thermometer, 2,5-xylenol (134.0 g), salicylaldehyde (33.7 g), p-toluenesulfonic acid (0.83 g) and toluene (268 g) were added and stirred on an oil bath at 115° C. for 16 hours while removing condensed water. The resulting mixture was filtered at a temperature of 50° to 60° C. to obtain a crude cake.

The crude cake was dissolved in methanol (580 g) at a temperature of 20° to 25° C. and charged into ion-exchanged water (1450 g). Thereafter, the resulting solution was filtered and dried to obtain the compound of the formula (a) (89.3 g). Yield, 93.0% (based of salicylaldehyde).

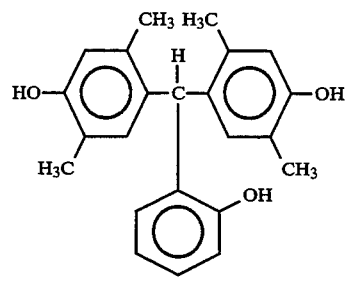

(a)

Melting point: 274°–275° C.

Synthetic Example 12

Into a three-necked 1000 ml flask, m-cresol (270 g) and a 1% aqueous solution of oxalic acid (48.7 g) were added. Then, to the mixture, a 37.0% aqueous solution of formalin (60.8 g) was dropwise added over 40 minutes while heating and stirring on an oil bath at 100° C. Thereafter, the reaction mixture was heated while stirring for further 2 hours. After neutralization, washing with water and removing water, a solution of a novolak resin in ethylcellosolve acetate was obtained.

The weight average molecular weight measured by GPC was 330.

Synthetic Example 13

In a three-necked 1000 ml flask, were added m-cresol (149 g), p-cresol (121 g), ethylcellosolve acetate (252 g) and a 5% aqueous solution of oxalic acid (30.4 g). Then, to the mixture, a 37.0% formalin (147.8 g) was dropwise added over 40 minutes while heating and stirring under reflux on an oil bath at 100° C. Thereafter, the reaction mixture was heated while stirring for further 7 hours. After neutralization, washing with water and removing water, a solution of a novolak resin in ethylcellosolve acetate was obtained.

The weight average molecular weight measured by GPC was 9600 as converted to polystyrene.

Synthetic Example 14

The solution of novolak resin in ethylcellosolve acetate obtained in Synthetic Example 13 (the content of the novolak resin being 41.2%) (120 g) was charged in a 3 liter separable flask having an outlet in a bottom, and then ethylcellosolve acetate (868.8 g) and n-heptane (544.6 g) were added. After stirring for 30 minutes at 20° C., the resulting mixture was left standing and separated. n-Heptane in the recovered lower layer was removed by an evaporator to obtain a novolak resin in ethylcellosolve acetate.

The weight average molecular weight measured by GPC was 15500 as converted to polystyrene. An area ratio in GPC of a range in which the molecular weight as converted to polystyrene is not larger than 900 was 7%.

Synthetic Example 15

In a three-necked 1000 ml flask, were added m-cresol (202.8 g), o-cresol (27.0 g), 2-tert.-butyl-5-methylphenol (61.6 g) [a molar ratio of them being 75:10:15], ethylcellosolve acetate (252 g) and a 5% aqueous solution of oxalic acid (30.4 g). Then, to the mixture, a 37.0% formalin (177.0 g) was dropwise added over 40 minutes while heating and stirring on an oil bath at 100° C. Thereafter, the reaction mixture was heated while stirring for further 10 hours. After neutralization, washing with water and removing water, a solution of a novolak resin in ethylcellosolve acetate was obtained.

The weight average molecular weight measured by GPC was 3500 as converted to polystyrene. An area ratio in GPC of a range in which the molecular weight as converted to polystyrene is not larger than 6000 was 82.8%, and an area ratio in GPC of a range in which the molecular weight as converted to polystyrene is not larger than 900 was 34.2%.

Synthetic Example 16

In the same manner as in Synthetic Example 15 but changing the reaction time, the reaction was carried out to obtain a solution of a novolak resin in ethylcellosolve acetate. The novolak resin had a weight average molecular weight measured by GPC of 5200 as converted to polystyrene.

Synthetic Example 17

In the same manner as in Synthetic Example 15 but changing the molar ratio of m-cresol:o-cresol:2-tert.-butyl-5-methylphenol to 70:10:20, the reaction was carried out to obtain a solution of a novolak resin in ethylcellosolve acetate. The novolak resin had a weight average molecular weight measured by GPC of 5800 as converted to polystyrene.

Synthetic Example 18

In the same manner as in Synthetic Example 15 but changing the molar ratio of m-cresol:o-cresol:2-tert.-butyl-5-methylphenol to 60:20:20, the reaction was carried out to obtain a solution of a novolak resin in ethylcellosolve acetate. The novolak resin had a weight average molecular weight measured by GPC of 4550 as converted to polystyrene.

Synthetic Example 19

The solution of the novolak resin in ethylcellosolve acetate obtained in Synthetic Example 15 (the content of the novolak resin being 36.50%) (157.8 g) was charged in a one liter separable flask having an outlet in a bottom, and then ethylcellosolve acetate (226.2 g) and n-heptane (189.3 g) were added. The mixture was stirred at 20° C. for 30 minutes, kept standing and separated. From the separated lower layer, n-heptane was evaporated off by an evaporator to obtain a solution of a novolak resin in ethylcellosolve acetate. The novolak resin had a weight average molecular weight measured by GPC of 5900 as converted to polystyrene. An area ratio in GPC of a range in which the molecular weight as converted to polystyrene is not larger than 6000 was 63.2%, and an area ratio in GPC of a range in which the molecular weight as converted to polystyrene is not larger than 900 was 14.9%.

Synthetic Examples 20 to 22

In the same manner as in Synthetic Example 19 but using one of the novolak resins prepared in Synthetic Examples 16, 17 and 18, a novolak resin shown in Table 2 was obtained.

TABLE 2

| Synthetic Example No. | Used novolak resin prepared in | Molecular weight[1] | Area ratio[2] (%) | Area ratio[3] (%) |
|---|---|---|---|---|
| 20 | Syn. Ex. 16 | 7900 | 54.1 | 12.7 |
| 21 | Syn. Ex. 17 | 10000 | 43.2 | 10.8 |
| 22 | Syn. Ex. 18 | 6750 | 42.4 | 11.1 |

Notes:
See Notes for Table 1.

Synthetic Example 23

In a three-necked 1000 ml flask, were added m-cresol (229.7 g), p-cresol (6.9 g), 2-tert.-butyl-5-methylphenol (51.3 g) [a molar ratio of them being 85:2.5:12.5], ethylcellosolve acetate (252 g) and a 5% aqueous solution of oxalic acid (30.4 g). Then, to the mixture, a 37.0% formalin (166.0 g) was dropwise added over 40 minutes while heating and stirring on an oil bath at 100° C. Thereafter, the reaction mixture was heated while stirring for further 22 hours. After neutralization, washing with water and removing water, a solution of a novolak resin in ethylcellosolve acetate was obtained.

The weight average molecular weight measured by GPC was 4000 as converted to polystyrene. An area ratio in GPC of a range in which the molecular weight as converted to polystyrene is not larger than 6000 was 80.7%, and an area ratio in GPC of a range in which the molecular weight as converted to polystyrene is not larger than 900 was 30.0%.

Synthetic Example 24

In the same manner as in Synthetic Example 23 but changing the reaction time, the reaction was carried out to obtain a solution of a novolak resin in ethylcellosolve acetate. The novolak resin had a weight average molecular weight measured by GPC of 6300 as converted to polystyrene.

Synthetic Example 25

In the same manner as in Synthetic Example 23 but changing the molar ratio of m-cresol:p-cresol:2-tert.-butyl-5-methylphenol to 80:5:15, the reaction was carried out to obtain a solution of a novolak resin in ethylcellosolve acetate. The novolak resin had a weight average molecular weight measured by GPC of 4400 as converted to polystyrene.

Synthetic Example 26

In the same manner as in Synthetic Example 23 but changing the molar ratio of m-cresol:p-cresol:2-tert.-butyl-5-methylphenol to 60:20:20, the reaction was carried out to obtain a solution of a novolak resin in ethylcellosolve acetate. The novolak resin had a weight average molecular weight measured by GPC of 3500 as converted to polystyrene.

Synthetic Example 27

The solution of the novolak resin in ethylcellosolve acetate obtained in Synthetic Example 23 (the content of the novolak resin being 44.88%) (155.0 g) was charged in a one liter separable flask having an outlet in a bottom, and then ethylcellosolve acetate (308.8 g) and n-heptane (228.6 g) were added. The mixture was stirred at 20° C. for 30 minutes, kept standing and separated. From the separated lower layer, n-heptane was evaporated off by an evaporator to obtain a solution of a novolak resin in ethylcellosolve acetate. The novolak resin had a weight average molecular weight measured by GPC of 6200 as converted to polystyrene. An area ratio in GPC of a range in which the molecular weight as converted to polystyrene is not larger than 6000 was 57.7%, and an area ratio in GPC of a range in which the molecular weight as converted to polystyrene is not larger than 900 was 12.1%.

Synthetic Examples 28 to 30

In the same manner as in Synthetic Example 27 but using one of the novolak resins prepared in Synthetic Examples 24, 25 and 26, a novolak resin shown in Table 3 was obtained.

TABLE 3

| Synthetic Example No. | Used novolak resin prepared in | Molecular weight*1) | Area ratio*2) (%) | Area ratio*3) (%) |
|---|---|---|---|---|
| 28 | Syn. Ex. 24 | 9100 | 44.0 | 8.5 |
| 29 | Syn. Ex. 25 | 8300 | 41.5 | 8.3 |
| 30 | Syn. Ex. 26 | 8200 | 46.1 | 9.5 |

Notes:
See Notes for Table 1.

Examples 1–16 and Comparative Examples 1 and 2

Each of the novolak resins obtained in Synthetic Examples 1 to 10 and 13 to 30 was dissolved together with a sensitizer and optionally the compound prepared in Synthetic Example 11 or the low molecular weight novolak prepared in Synthetic Example 12 in ethylcellosolve acetate in amounts in Table 4 to prepare a resist solution. The amount of the solvent was adjusted to form a film having a thickness of 1.28 μm when the resist solution was applied under the coating conditions below.

Each composition was filtered through a Teflon (trade mark) filter of 0.2 μm in pore size to prepare a resist solution. The solution was then coated on a silicon wafer, which had been rinsed in a usual manner, by means of a spinner at 4000 rpm. The coated silicon wafer was baked for one minute on a vacuum adsorption-type hot plate kept at 100° C. and exposed to light the exposure time of which was varied stepwise at each shot by means of a reduction projection exposure apparatus with an extra-high-pressure mercury lamp as a light source. After exposure, the silicon wafer was observed with an optical microscope to find whether a part of the patter disappeared or not. Thereafter, the silicon wafer was baked for one minute on the vacuum adsorp-tion-type hot plate kept at 110° C., and then developed for one minute in a developer (SOPD (trade name) manufactured by Sumitomo Chemical Company, Limited) to obtain a positive pattern. After rinsing and drying, the amount of film thickness loss for each shot was plotted against the exposure time to calculate sensitivity. The film thickness retention was calculated from the remaining film thickness in the unexposed area.

Also, the silicon wafer having a resist pattern was placed for 30 minutes in a clean oven set at various temperatures in the air, and the heat resistance was evaluated by observing the resist pattern by means of a scanning electron microscope.

The fidelity of pattern during exposure is evaluated according to the following criteria:
○: Good.
×X: Fair.

The results are shown in Table 4.

As seen from the results of Table 4, the resist solutions prepared in Examples provided the balanced properties. In particular, patter disappearance during exposure (decrease of fidelity of the pattern to the mask) was not observed.

TABLE 4

| Example No. | 1 | 2 | 3 | 4 | 5 | 6 | 7 | 8 | 9 | 10 | 11 | 12 | 13 | 14 | 15 | 16 | C. 1 | C. 2 |
|---|---|---|---|---|---|---|---|---|---|---|---|---|---|---|---|---|---|---|
| Kind of resin (Synthetic Example No.) | 6 | 7 | 8 | 9 | 10 | 4 | 19 | 20 | 21 | 22 | 15 | 27 | 28 | 29 | 30 | 23 | 13 | 14 |
| Amount of resin (parts) | 11 | 11 | 11 | 11 | 11 | 14 | 11 | 11 | 11 | 11 | 14 | 11 | 11 | 11 | 11 | 14 | 17 | 17 |
| Compound (II) in Synthetic Example 11 | 2.8 | 3.2 | 3.9 | 3.5 | — | — | 3.2 | 3.5 | 3.5 | — | 3.2 | 3.5 | 3.5 | — | — | — | — | — |
| Low M.W. novolak (III) in Synthetic Example 12 | — | — | — | — | 3.7 | — | — | — | — | 3.7 | — | — | — | — | 3.7 | — | — | — |
| Sensitizer: Kind*1) | (1) | (1) | (1) | (1) | (2) | (1) | (1) | (1) | (1) | (2) | (1) | (1) | (1) | (1) | (2) | (1) | (2) | (2) |
| Amount (parts) | 4.1 | 4.1 | 4 | 4 | 4.5 | 4 | 4.1 | 4.1 | 4 | 4.5 | 4 | 4.1 | 4.1 | 4 | 4.5 | 4 | 4.5 | 4 |
| Sensitivity (msec) | 490 | 340 | 400 | 370 | 260 | 380 | 250 | 310 | 470 | 340 | 260 | 170 | 300 | 370 | 280 | 180 | 85 | 980 |
| Film thickness retention (%) | 100 | 100 | 100 | 99.5 | 99.0 | 99.5 | 100 | 100 | 99.5 | 100 | 99.5 | 100 | 100 | 99.5 | 100 | 99.5 | 77.2 | 100 |
| Heat resistance*3) °C. | 150 | 150 | 150 | 150 | 150 | 150 | 150 | 150 | 150 | 150 | 150 | 150 | 150 | 150 | 150 | 150 | 140 | 150 |
| Resolution*4) (micrometers) | 0.5 | 0.55 | 0.55 | 0.55 | 0.6 | 0.6 | 0.55 | 0.55 | 0.5 | 0.6 | 0.6 | 0.55 | 0.55 | 0.55 | 0.6 | 0.6 | 0.9 | 1.0 |
| Fidelity of pattern during exposure | O | O | O | O | O | O | O | O | O | O | O | O | O | O | O | O | X | X |

Note:
*1)A condensation product of naphthoquinone-(1,2)-diazide-(2)-5-sulfonyl chloride with hydroxyflavan (2.6 hydroxy groups are esterified on the average).
*2)A condensation product of naphthoquinone-(1,2)-diazide-(2)-5-sulfonyl chloride with 2,3,4,4'-tetrahydroxybenzophenone (2.5 hydroxy groups are esterified on the average).
*3)The temperature in the clean over at which the resist pattern begins to soften and flow.
*4)The minimum line width where the lines and spaces are resolved.

What is claimed is:

1. A positive resist composition comprising, in admixture, a 1,2-quinone diazide compound and an alkali-soluble resin which comprises a resin (I) obtainable through a condensation reaction of a phenol mixture consisting of m-cresol and 2-tert.-butyl-5-methylphenol with formaldehyde, wherein said 1,2-quinone diazide compound is prepared by a condensation reaction of at least one compound selected from the group consisting of 1,2-naphthoquinone diazide sulfonyl chloride and benzoquinone diazide sulfonyl chloride with at least one compound having a hydroxyl group selected from the group consisting of hydroquinone, resorcinol, phloroglucin, 2,4-dihydroxybenzophenone, 2,3,4-trihydroxybenzophenone, 2,3,4,4'-tetrahydroxybenzophenone, 2,2',4,4'-tetrahydroxybenzophenone, bis(p-hydroxyphenyl)methane, bis(2,4-dihydroxyphenyl)-methane, bis(2,3,4-trihydroxyphenyl)methane, 2,2-bis(2,4-dihydroxyphenyl)propane, 2,2-bis(2,3,4-trihydroxyphenyl)propane and hydroxyflavan compounds.

2. A positive resist composition comprising, in admixture, a 1,2-quinone diazide compound and an alkali-soluble resin which comprises a resin obtainable through a condensation reaction of a phenol mixture of 40 to 85% by mole of m-cresol, 5 to 50% by mole of o-cresol and 10 to 55% by mole of 2-tert.-butyl-5-methylphenol, with formaldehyde, wherein said 1, 2-quinone diazide compound is prepared by a condensation reaction of at least one compound selected from the group consisting of 1,2-naphthoquinone diazide sulfonyl chloride and benzoquinone diazide sulfonyl chloride with at least one compound having a hydroxyl group selected from the group selected from the group consisting of hydroquinone, resorcinol, phloroglucin, 2,4-dihydroxybenzophenone, 2,3,4-trihydroxybenzophenone, 2,3,4,4'-tetrahydroxybenzophenone, 2,2',4,4'-tetrahydroxybenzophenone, bis(p-hydroxyphenyl)methane, bis(2,4-dihydroxyphenyl)-methane, bis(2,3,4-trihydroxyphenyl)methane, 2,2-bis(2,4-dihydroxyphenyl)propane, 2,2-bis(2,3,4-bis(2,3,4-trihydroxyphenyl)-propane and hydroxyflavan compounds.

3. A positive resist composition comprising, in admixture, a 1,2-quinone diazide compound and an alkali-soluble resin which comprises a resin obtainable through a condensation reaction of a phenol mixture of 40 to 87.5% by mole of m-cresol, 2.5 to 50 % by mole of p-cresol and 10 to 57.5% by mole of 2-tert.-butyl-5-methylphenol, with formaldehyde, wherein said 1,2-quinone diazide compound is prepared by a condensation reaction of at least one compound selected from the group consisting of 1,2-naphthoquinone diazide sulfonyl chloride and benzoquinone diazide sulfonyl chloride with at least one compound having a hydroxyl group selected from the group consisting of hydroquinone, resorcinol, phloroglucin, 2,4-dihydroxybenzophenone, 2,3,4- trihydroxybenzophenone, 2,3,4,4'-tetrahydroxybenzophenone, 2,2',4,4'-tetrahydroxybenzophenone, bis(p-hydroxyphenyl)methane, bis(2,4-dihydroxyphenyl)-methane, bis(2,3,4-trihydroxyphenyl)methane, 2,2-bis(2,4-dihydroxyphenyl)propane, 2,2-bis(2,3,4-trihydroxyphenyl)-propane and hydroxyflavan compounds.

4. The positive resist composition according to claim 1, wherein a molar ratio of m-cresol to 2-tert.-butyl-5-methylphenol is from 95:5 to 60:40.

5. The positive resist composition according to claim 1, wherein said resin (I), is characterized in that an area ratio in GPC of a range in which the molecular weight as converted to polystyrene is not larger than 6000 does not exceed 65% and an area ratio in GPC of a range in which the molecular weight as converted to polystyrene is not larger than 900 does not exceed 30%, and wherein said positive resist further contains a compound of the formula:

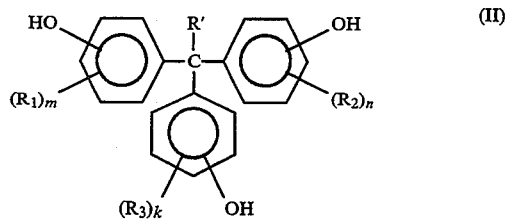

wherein $R_1$, $R_2$ and $R_3$ are the same or different and each a $C_1$–$C_5$ alkyl group or a $C_1$–$C_5$ alkoxy group; $R'$ is a hydrogen atom or a $C_1$–$C_3$ alkyl group; and k, m and n are each an integer of 0 to 3.

6. The positive resist composition according to claim 4, wherein said resin (I), is characterized in that an area ratio in GPC of a range in which the molecular weight as converted to polystyrene is not larger than 6000 does not exceed 65% and an area ratio in GPC of a range in which the molecular weight as converted to polystyrene is not larger than 900 does not exceed 30%, and wherein said positive resist further contains a compound of the formula:

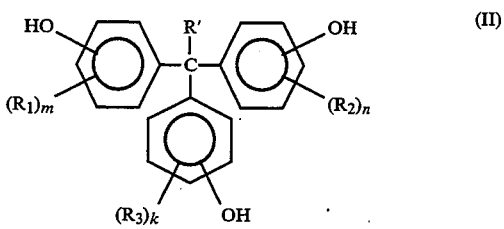

wherein $R_1$, $R_2$ and $R_3$ are the same or different and each a $C_1$–$C_5$ alkyl group or a $C_1$–$C_5$ alkoxy group; $R'$ is a hydrogen atom or a $C_1$–$C_3$ alkyl group; and k, m and n are each an integer of 0 to 3.

7. The positive resist composition according to claim 2, wherein said resin (IV), is characterized in that an area ratio in GPC of a range in which the molecular weight as converted to polystyrene is not larger than 6000 does not exceed 65% and an area ratio in GPC of a range in which the molecular weight as converted to polystyrene is not larger than 900 does not exceed 30%, and wherein said positive resist further contains a compound of the formula:

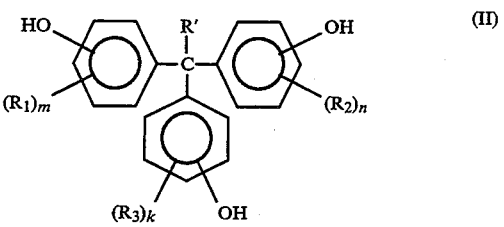

wherein $R_1$, $R_2$ and $R_3$ are the same or different and each a $C_1$–$C_5$ alkyl group or a $C_1$–$C_5$ alkoxy group; $R'$ is a hydrogen atom or a $C_1$–$C_3$ alkyl group; and k, m and n are each an integer of 0 to 3.

8. The positive resist composition according to claim 3, wherein said resin (V), is characterized in that an area ratio in GPC of a range in which the molecular weight as converted to polystyrene is not larger than 6000 does not exceed 65% and an area ratio in GPC of a range in which the molecular weight as converted to polystyrene is not larger than 900 does not exceed 30%, and wherein said positive resist further contains a compound of the formula:

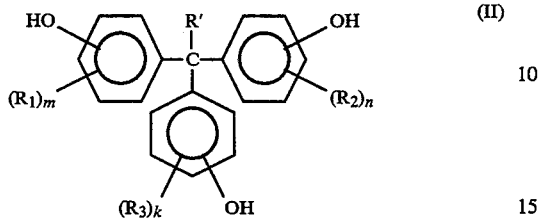

wherein $R_1$, $R_2$ and $R_3$ are the same or different and each a $C_1$–$C_5$ alkyl group or a $C_1$–$C_5$ alkoxy group; R' is a hydrogen atom or a $C_1$–$C_3$ alkyl group; and k, m and n are each an integer of 0 to 3.

9. The positive resist composition according to claim 5, wherein $R_1$ and $R_2$ are both methyl groups, R' is a hydrogen atom, m and n are both 2, and k is 0 (zero) in the formula (II).

10. The positive resist composition according to claim 5, wherein a content of the compound (II) is from 4 to 50 parts by weight per 100 parts by weight of the total weight of the alkali-soluble resin.

11. The positive resist composition according to claim 6, wherein $R_1$ and $R_2$ are both methyl groups, R' is a hydrogen atom, m and n are both 2, and k is 0 (zero) in the formula (II).

12. The positive resist composition according to claim 6, wherein a content of the compound (II) is from 4 to 50 parts by weight per 100 parts by weight of the total weight of the alkali-soluble resin.

13. The positive resist composition according to claim 7, wherein $R_1$ and $R_2$ are both methyl groups, R' is a hydrogen atom, m and n are both 2, and k is 0 (zero) in the formula (II).

14. The positive resist composition according to claim 7, wherein a content of the compound (II) is from 4 to 50 parts by weight per 100 parts by weight of the total weight of the alkali-soluble resin.

15. The positive resist composition according to claim 8, wherein $R_1$ and $R_2$ are both methyl groups, R' is a hydrogen atom, m and n are both 2, and k is 0 (zero) in the formula (II).

16. The positive resist composition according to claim 8, wherein a content of the compound (II) is from 4 to 50 parts by weight per 100 parts by weight of the total weight of the alkali-soluble resin.

17. The positive resist composition according to claim 1, wherein a molar ratio of m-cresol to 2-tert.-butyl-5-methylphenol is from 95:5 to 70:30.

18. The positive resist composition according to claim 5, wherein said compound of formula (II) is selected from the group consisting of:

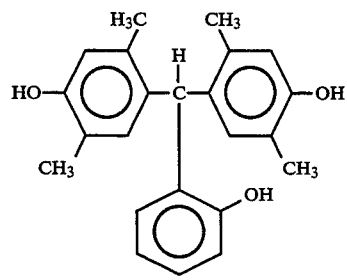

and

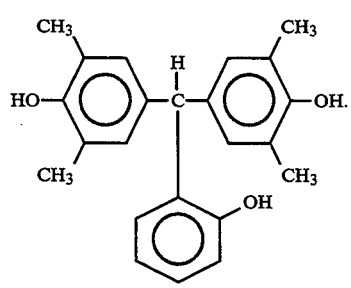

19. The positive resist composition according to claim 6, wherein said compound of formula (II) is selected from the group consisting of:

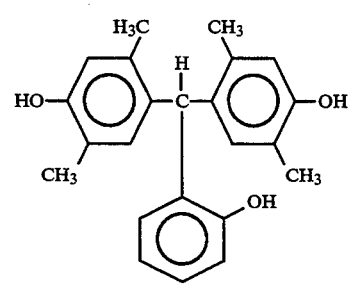

and

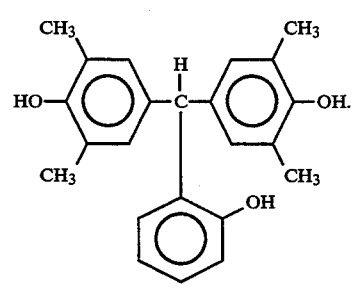

20. The positive resist composition according to claim 7, wherein said compound of formula (II) is selected from the group consisting of:

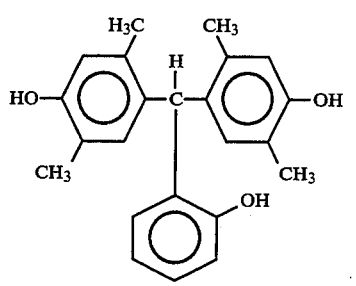
and
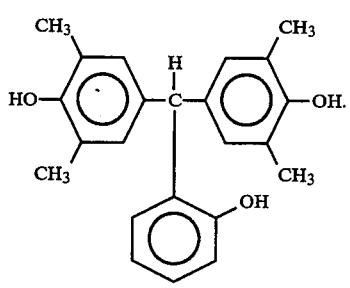
21. The positive resist composition according to claim 8, wherein said compound of formula (II) is selected from the group consisting of:
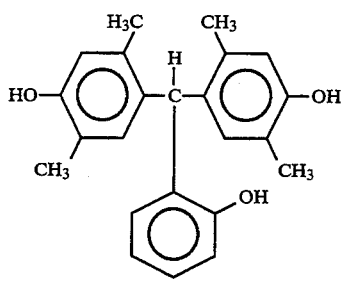
and
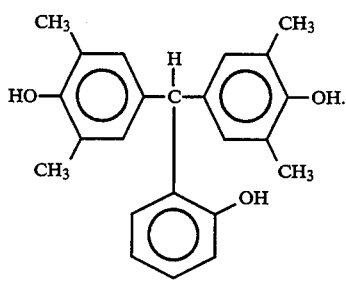
* * * * *